US012726103B2

(12) United States Patent
Jiang

(10) Patent No.: US 12,726,103 B2
(45) Date of Patent: *Sep. 1, 2026

(54) POWER SWITCH DEACTIVATION DRIVER

(71) Applicant: TEXAS INSTRUMENTS INCORPORATED, Dallas, TX (US)

(72) Inventor: Connie Jiang, Shanghai (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/599,580

(22) Filed: Mar. 8, 2024

(65) Prior Publication Data

US 2025/0286448 A1 Sep. 11, 2025

Related U.S. Application Data

(63) Continuation of application No. 17/708,045, filed on Mar. 30, 2022, now Pat. No. 11,979,082.

(51) Int. Cl.

| | |
|---|---|
| ***H02M 1/08*** | (2006.01) |
| ***H02M 1/00*** | (2006.01) |
| ***H02M 3/155*** | (2006.01) |
| ***H03K 17/16*** | (2006.01) |

(52) U.S. Cl.

CPC ........... *H02M 1/08* (2013.01); *H02M 1/0009* (2021.05); *H02M 3/155* (2013.01); *H03K 17/166* (2013.01); *H03K 2217/0063* (2013.01); *H03K 2217/0072* (2013.01)

(58) Field of Classification Search

CPC ...... H02M 1/08; H02M 3/155; H03K 17/166; H03K 2217/0063; H03K 2217/0072

USPC .......................... 323/282; 327/108, 109, 110

See application file for complete search history.

(56) References Cited

U.S. PATENT DOCUMENTS

| | | | | |
|---|---|---|---|---|
| 4,553,048 | A * | 11/1985 | Bynum | G05F 3/30 361/103 |
| 6,271,708 | B1 * | 8/2001 | Hoshi | H03K 17/567 327/377 |
| 8,610,485 | B2 * | 12/2013 | Hiyama | H03K 17/168 327/170 |
| 9,812,941 | B2 * | 11/2017 | Sicard | H02M 1/08 |
| 10,968,880 | B1 | 4/2021 | Yamagishi | |
| 10,979,032 | B1 * | 4/2021 | Leong | H03K 17/56 |
| 11,031,929 | B1 * | 6/2021 | Maier | H03K 17/04206 |
| 11,595,035 | B1 * | 2/2023 | Li | H03K 17/165 |

(Continued)

FOREIGN PATENT DOCUMENTS

WO 2022018757 A1 1/2022

OTHER PUBLICATIONS

PCT Search Report dated Jun. 28, 2023.

*Primary Examiner* — William Hernandez

(74) *Attorney, Agent, or Firm* — Zhenhai Fu; Frank D. Cimino

(57) ABSTRACT

One example includes a power supply system. The system includes a power switch configured to activate via a control voltage responsive to a first state of an activation signal to conduct current from a power rail to a switching terminal. The system further includes a power switch deactivation driver configured to control an amplitude of the control voltage responsive to a second state of the activation signal based on a voltage difference between the power rail and the switching terminal to provide for a variable rate of deactivation of the power switch.

20 Claims, 3 Drawing Sheets

(56) References Cited

U.S. PATENT DOCUMENTS

2009/0256618 A1* 10/2009 Yamawaki ............. H03K 17/08
327/377
2011/0050316 A1* 3/2011 Sicard ..................... H02P 7/288
327/309
2011/0122659 A1* 5/2011 Duan ................ H02M 3/33507
363/21.16
2013/0147523 A1 6/2013 Deboy
2015/0280416 A1* 10/2015 Kreuter .................... H02H 3/08
361/55
2021/0152169 A1* 5/2021 Wong .................... H02M 1/088
2023/0006538 A1* 1/2023 Zhou .................... H03K 17/687
2023/0006657 A1* 1/2023 Jia .......................... H03K 3/012
2023/0318437 A1* 10/2023 Jiang ..................... H02M 3/155
327/109
2024/0106318 A1* 3/2024 Kwak ..................... H02M 1/08
2025/0030331 A1* 1/2025 Zhou ...................... H03K 17/06

* cited by examiner

POWER SWITCH DEACTIVATION DRIVER

CROSS-REFERENCE TO RELATED APPLICATIONS

The present application is a continuation of U.S. patent application Ser. No. 17/708,045 filed Mar. 30, 2022, which is incorporated herein by reference in its entirety.

TECHNICAL FIELD

This description relates generally to electronic systems, and more particularly to a power switch deactivation driver.

BACKGROUND

Switching power supplies are widely implemented in circuits to provide efficient power. A typical power supply, such as a DC-DC converter, includes a power stage having a transistor. One such DC-DC converter includes a high-side transistor and a low-side transistor that are coupled between an input terminal $V_{IN}$ and a ground terminal GND, with a switching terminal between the high-side and low-side transistors. The high-side transistor and the low-side transistor can thus be alternately activated to provide current through an inductor coupled to the switching terminal. For example, when the high-side transistor is activated, a current flows from an input terminal on which an input voltage is provided through the high-side transistor to the switching terminal, and when the low-side transistor is activated, a current flows from a ground terminal through the low-side transistor to the switching terminal. Activation and deactivation of the high-side and low-side transistors results in switching loss, which is proportional to an input voltage provided at the input terminal, and inversely proportional to an activation/deactivation speed.

SUMMARY

One example includes a power supply system. The system includes a power switch configured to activate via a control voltage responsive to a first state of an activation signal to conduct current from a power rail to a switching terminal. The system further includes a power switch deactivation driver configured to control an amplitude of the control voltage responsive to a second state of the activation signal based on a voltage difference between the power rail and the switching terminal to provide for a variable rate of deactivation of the power switch.

Another example described herein includes a power switch deactivation driver to control a power switch configured to by a first state of an activation signal to conduct current from a power rail to a switching terminal. The power switch deactivation driver includes a sense resistor coupled to the power rail to conduct a sense current having an amplitude based on a voltage difference between the power rail and the switching terminal responsive to a second state of the activation signal opposite the first state. The power switch deactivation driver further includes a shutoff switch configured to control an amplitude of a control voltage configured to control an activation of the power switch. The shutoff switch can be controlled by the amplitude of the sense current to provide for a variable rate of deactivation of the power switch.

Another example described herein includes an integrated circuit. The circuit includes a power switch comprising an input, a first terminal coupled to a power rail, and a second terminal coupled to a switching terminal. The circuit also includes a power switch deactivation driver. The power switch deactivation driver includes a shutoff switch comprising an input, a first terminal coupled to the input of the power switch, and a second terminal coupled to the switching terminal or the power rail. The power switch deactivation driver also includes a first sense resistor comprising a first terminal coupled to the power rail or the switching terminal and a second terminal and a second sense resistor comprising a first terminal coupled to the input of the shutoff switch. The power switch deactivation driver also includes a first current mirror transistor comprising a first terminal coupled to the first sense resistor and a second terminal coupled to the other of the power rail or the switching terminal. The power switch deactivation driver further includes a second current mirror transistor comprising a first terminal coupled to the second sense resistor and the input of the shutoff switch, the second current mirror transistor also comprising a second terminal coupled to the other of the power rail or the switching terminal.

DETAILED DESCRIPTION

Figure 1:
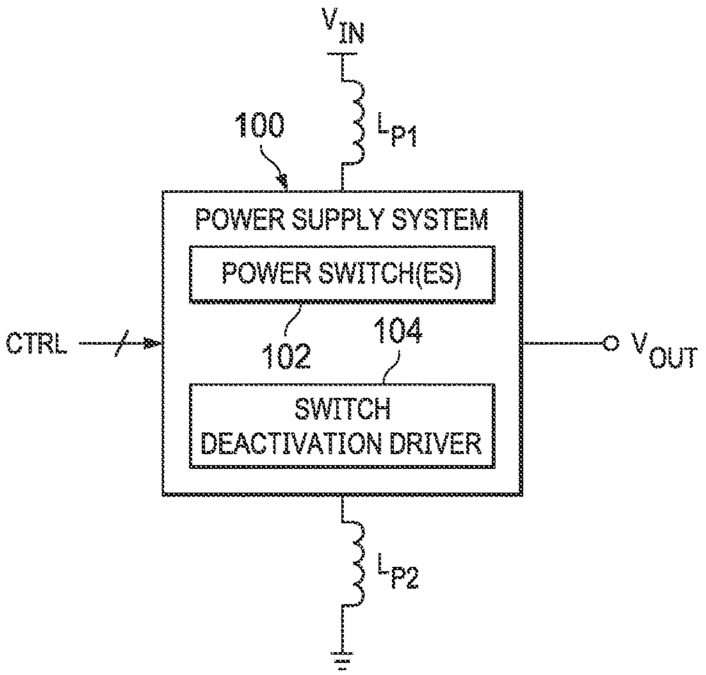
FIG. 1 is an example block diagram of a power supply system.

This description relates generally to electronic systems, and more particularly to a power switch deactivation driver. The power switch deactivation driver can be implemented in any of a variety of power supply circuits. A power supply circuit can include a power switch that is activated via an activation signal to conduct current from one of a power rail and a switching terminal based on a control voltage. The power switch can correspond to one of the high-side and low-side power switches in a DC-DC buck power supply, or can correspond to a low-side power switch in a DC-DC boost power supply. The power switch deactivation driver can be configured to control an amplitude of the control voltage responsive to a second state of the activation signal, with the amplitude of the control voltage being based on a voltage difference between the power rail and the switching terminal to provide for a variable rate of deactivation of the power switch.

As described herein, the term “activate” with respect to a transistor (including the power switch) refers to a transition of the transistor state from cutoff mode through linear mode to saturation mode. As described herein, the term “deactivate” with respect to a transistor (including the power switch) refers to a transition of the transistor state from saturation mode through linear mode to cutoff mode. As described herein, the term “variable rate of the deactivation” with respect to the power switch refers to a non-linear decrease of the control voltage to deactivate the power switch. As an example, the variable rate of deactivation can include an initially rapid deactivation of the power switch based on a more rapid rate of decrease of the control voltage, followed by a slower deactivation of the power switch based on a slower rate of decrease of the control voltage. The variable rate of deactivation can provide for optimization of efficiency and a reduction of ringing of the current through the power switch during deactivation of the power switch, as described in greater detail herein.

For example, the power switch deactivation driver can include a first sense transistor that can conduct a first sense current having an amplitude that is based on a difference between the voltages of the power rail and the switching terminal. The power switch deactivation driver also includes a current mirror and a second sense resistor, such that the current mirror generates a second sense current through the second sense resistor, with the second sense current having an amplitude that is proportional to the first sense current. The second sense resistor can be coupled to a control terminal (e.g., gate) of a shutoff transistor. The shutoff transistor can be coupled to the control terminal of the power switch, such that the shutoff transistor can control the deactivation of the power switch. As a result, based on the voltage difference between the power rail and the switching terminal, the shutoff transistor can control the deactivation of the power switch at a variable rate.

FIG. 1 is an example block diagram of a power supply system 100. The power supply system 100 can be a DC-DC power supply that generates an output voltage $V_{OUT}$ based on a high-voltage rail, demonstrated in the example of FIG. 1 as an input voltage $V_{IN}$, responsive to a set of control signals CTRL. As an example, the power supply system can be arranged as a buck converter or a boost converter. The power supply system 100 can be included in or as part of an integrated circuit (IC).

In the example of FIG. 1, the power supply system 100 includes one or more power switches 102. In the example of the power supply system 100 being arranged as a buck converter, the power switch(es) 102 can include a high-side switch and a low-side switch that are arranged between the input voltage $V_{IN}$ and a low-voltage rail, demonstrated in the example of FIG. 1 as ground, with a switching terminal arranged therebetween. In the example of the power supply system 100 being arranged as a boost converter, the power switch(es) 102 can include a low-side switch that is arranged between the low-voltage rail and the switching terminal. As an example, the power switch(es) 102 can be arranged as N-channel field effect transistors (NFETs). Each of the power switch(es) 102 is activated via an activation signal (e.g., one of the control signals CTRL) to conduct current from one of a power rail and a switching terminal based on a control voltage.

In the example of FIG. 1, the input voltage $V_{IN}$ is provided to the power supply system 100 via an inductor $L_{p1}$ that represents a parasitic inductance associated with a pin of the associated IC package on which the power supply system 100 is provided (e.g., to receive the input voltage $V_{IN}$ externally). Similarly, the power supply system 100 is coupled to ground via an inductor $L_{P2}$ that represents a parasitic inductance associated with another pin of the associated IC package on which the power supply system 100 is provided (e.g., to couple the IC package to an external ground). Responsive to a rapid deactivation of the power switch(es) 102, the current that was provided through the respective power switch(es) 102 can ring (e.g., oscillate) based on the inductance of the parasitic inductors $L_{P1}$ and $L_{P2}$. Excessive ringing can potentially result in damage to the IC on which the power supply system 100 is provided. However, slow deactivation can result in greater switching losses, and thus less efficient operation of the power supply system 100.

To optimize the deactivation of the power switch(es) 102, the power supply system 100 also includes a power switch deactivation driver 104. The power switch deactivation driver 104 can be configured to control an amplitude of the control voltage that controls the power switch(es) 102 responsive to a second state of the activation signal. The amplitude of the control voltage can be controlled based on a voltage difference between the power rail (e.g., one of the input voltage $V_{IN}$ and ground) and the switching terminal to provide for a variable rate of deactivation of the power switch(es) 102. As an example, the variable rate of deactivation can include an initially rapid deactivation of the power switch(es) 102 based on a more rapid rate of decrease of the control voltage, followed by a slower deactivation of the power switch(es) 102 based on a slower rate of decrease of the control voltage. As described in greater detail herein, the variable rate of deactivation can include three stages from full activation (e.g., saturation mode) of the power switch(es) 102 to full deactivation (e.g., cutoff mode) of the power switch(es) 102. The variable rate of deactivation can provide for optimization of efficiency and a reduction of ringing of the current through the power switch(es) 102 during deactivation of the power switch(es) 102.

Figure 2:
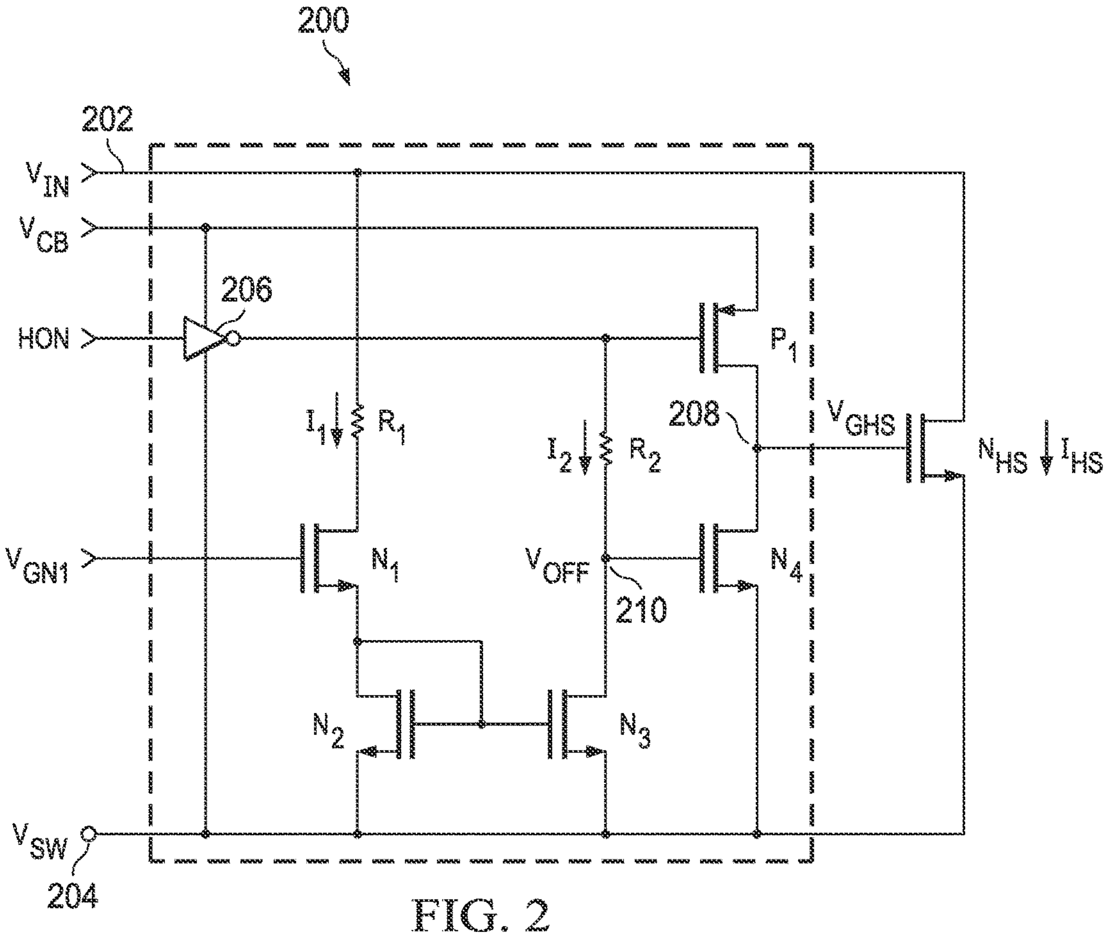
FIG. 2 is an example diagram of a power switch deactivation driver.

FIG. 2 is an example diagram of a power switch deactivation driver 200. The power switch deactivation driver 200 can correspond to the power switch deactivation driver 104 in the example of FIG. 1. Therefore, reference is to be made to the example of FIG. 1 in the following description of the example of FIG. 2. In the example of FIG. 2, the power switch deactivation driver 200 provides control of a high-side power switch, demonstrated as an NFET $N_{HS}$.

The power switch deactivation driver 200 receives the input voltage $V_{IN}$ at a high-voltage rail 202, and receives an activation signal HON. The activation signal HON controls the activation and deactivation state of the power switch $N_{HS}$. Responsive to an activated state of the power switch $N_{HS}$, a current $N_{HS}$ flows from the high-voltage rail 202 to a switching terminal 204. The current $N_{HS}$ can thus be provided through an inductor to provide the output voltage $V_{OUT}$. The power switch deactivation driver 200 also receives a voltage $V_{CB}$ and a voltage $V_{GN1}$. The voltage $V_{CB}$ can be based on a voltage $V_{SW}$ of the switching terminal 204, such as based on being coupled to the switching terminal 204 by a capacitor (not shown). For example, the voltage $V_{CB}$ can be greater than the voltage $V_{SW}$ by approximately 5V. The voltage $V_{GN1}$ can be provided responsive to a second state of the activation signal HON, as described in greater detail herein. As an example, the high-voltage rail 202, the switching terminal 204, and the voltage $V_{CB}$ can be coupled to external pins of the associated IC package.

The activation signal HON is a binary signal provided through an inverter 206 to provide a signal HON'. The inverter 206 is demonstrated as biased by the high-voltage rail 202 and the switching terminal 204. Responsive to a first state of the activation signal HON (e.g., logic-high), the power switch $N_{HS}$ is activated. In the example of FIG. 2, the logic-high state of the activation signal HON is inverted to provide the signal HON' at a logic-low state. The inverted activation signal HON' is provided to the gate of a P-channel FET $P_1$. The PFET $P_1$ has a drain that is coupled to a control node 208 and a source that is coupled to the voltage $V_{CB}$. The control node 208 is coupled to the gate of the power switch $N_{HS}$, such that a control voltage $V_{GHS}$ controls the activation of the power switch $N_{HS}$. Therefore, responsive to the logic-low state of the inverted activation signal HON', the PFET $P_1$ is activated, thereby pulling the control voltage $V_{GHS}$ to be approximately equal to the voltage $V_{CB}$. Accordingly, the power switch $N_{HS}$ is activated to conduct the current $I_{HS}$ to the switching terminal 204.

Responsive to a second state of the activation signal HON (e.g., logic-low), the power switch $N_{HS}$ is deactivated at a variable rate of deactivation, as described herein. In the example of FIG. 2, the logic-low state of the activation signal HON is inverted to provide the signal HON' at a logic-high state. Therefore, responsive to the logic-high state of the inverted activation signal HON', the PFET $P_1$ is deactivated. Approximately concurrently with the falling-edge of the activation signal HON, the voltage $V_{GN1}$ is provided to activate an NFET $N_1$ having a drain coupled to a first sense resistor $R_1$ and a source coupled to an NFET $N_2$ that is coupled at a source to the switching terminal 204 and is diode-connected based on having a common gate-drain coupling. Upon activation, the NFET $N_1$ thus conducts a first sense current $I_1$ from the input voltage $V_{IN}$ through the first sense resistor $R_1$ and through the NFETs $N_1$ and $N_2$ to the switching terminal 204. Therefore, the first sense current $I_1$ is proportional to a voltage difference between the voltage $V_{IN}$ at the high-voltage rail 202 and the voltage $V_{SW}$ at the switching terminal 204.

The gate of the NFET $N_2$ is coupled via the gate of an NFET $N_3$, such that the NFETs $N_2$ and $N_3$ are arranged as a current mirror. As an example, the NFET $N_3$ can be larger than the NFET $N_2$ (e.g., with respect to a channel width) by a factor K. Thus, the first sense current $I_1$ flowing through the NFET $N_2$ is mirrored through the NFET $N_3$ as a second sense current $I_2$ that is proportional (e.g., by the factor K) to the first sense current $I_1$. The second sense current $I_2$ flows from the inverted activation signal HON', through a second sense resistor $R_2$, and through the NFET $N_3$ to the switching terminal 204. The drain of the NFET $N_3$ and the second sense resistor $R_2$ are each coupled to a shutoff node 210 having a voltage $V_{OFF}$. The gate of a shutoff switch $N_4$ is coupled to the shutoff node 210, with the drain of the shutoff switch $N_4$ being coupled to the control node 208 and the source of the shutoff switch $N_4$ being coupled to the switching terminal 204. Therefore, the shutoff switch $N_4$ controls the deactivation of the power switch $N_{HS}$. For example, the second sense current $I_2$ can change the amplitude of the voltage $V_{OFF}$ in a variable manner responsive to the transition of the activation signal HON to a logic-low state, such that the activation of the NFET $N_4$ in a variable rate manner provides for a variable rate of change of the control voltage $V_{GHS}$. Accordingly, the power switch $N_{HS}$ is deactivated in a variable rate manner.

As an example, the voltage $V_{OFF}$ can be expressed as follows:

$$V_{OFF}=V_{CB}-K^*(V_{IN}-V_{SW})^*R_2/R_1 \qquad \text{Equation 1}$$

Therefore, the amplitude of the voltage $V_{OFF}$ is based on a voltage difference $V_{DIFF}$ between the input voltage $V_{IN}$ and the voltage $V_{SW}$. At larger values of the voltage difference $V_{DIFF}$, the amplitude of the voltage $V_{OFF}$ is smaller, and at smaller values of the voltage difference $V_{DIFF}$, the amplitude of the voltage $V_{OFF}$ is larger. As a result, the voltage $V_{OFF}$ can have an initial amplitude that is larger, thereby providing a rapid decrease of the control voltage $V_{GHS}$ and a respective rapid deactivation rate of the power switch $N_{HS}$. As the voltage $V_{SW}$ decreases responsive to the rapid deactivation of the power switch $N_{HS}$, the voltage $V_{OFF}$ can begin to decrease, thereby providing a slower deactivation of the power switch $N_{HS}$.

Figure 3:
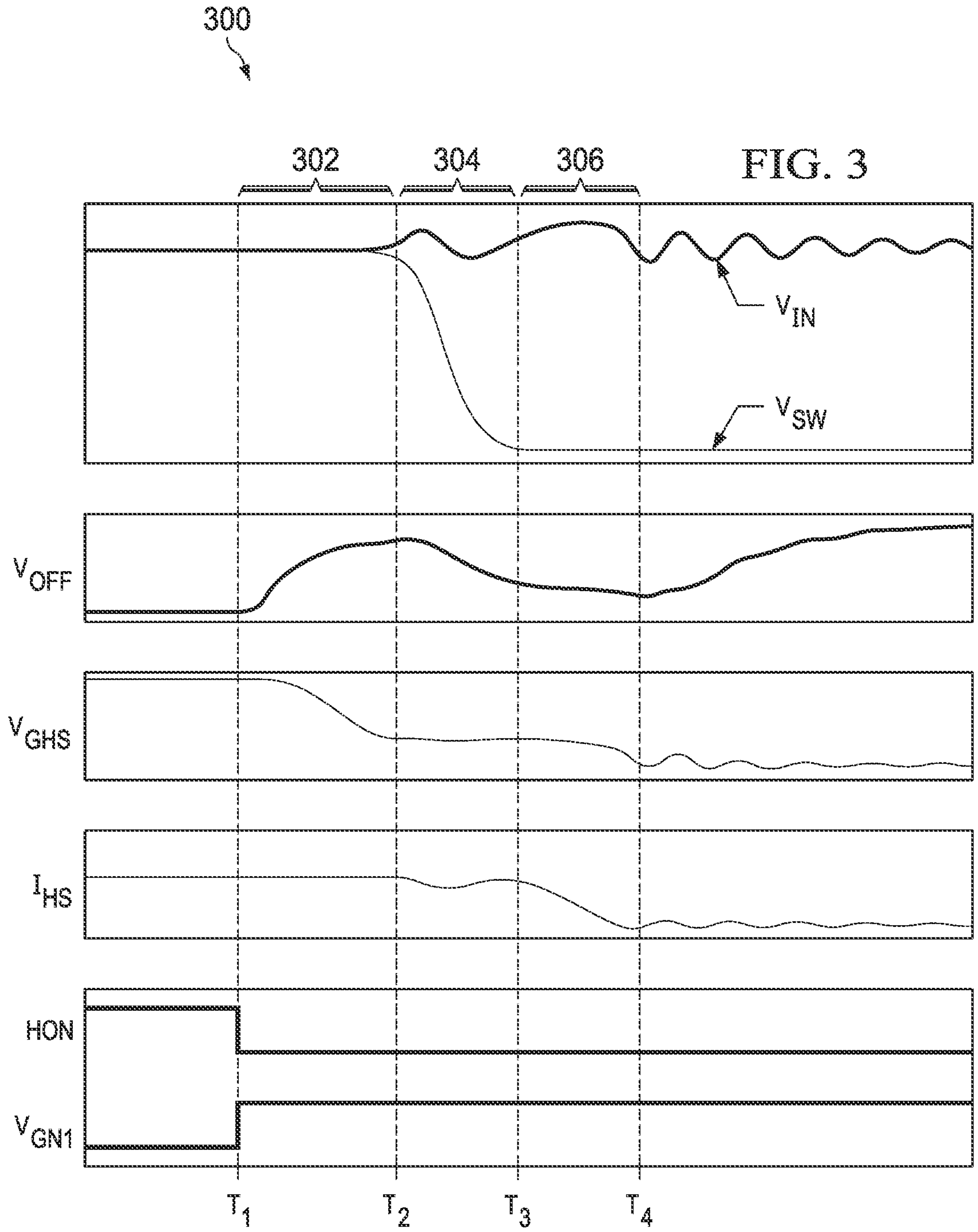
FIG. 3 is an example of a timing diagram.

FIG. 3 is an example of a timing diagram 300. The timing diagram 300 can correspond to deactivation of the power switch $N_{HS}$. Therefore, reference is to be made to the example of FIG. 2 in the following description of the example of FIG. 3.

The timing diagram 300 demonstrates the input voltage $V_{IN}$, the voltage $V_{SW}$, the voltage $V_{OFF}$, the control voltage $V_{GHS}$, the current $I_{HS}$, the activation signal HON, and the voltage $V_{GN1}$ plotted as a function of time. At a time $T_1$, a first stage of deactivation of the power switch $N_{HS}$, demonstrated at 302, begins based on a logic-state change of the activation signal HON from logic-high to logic-low. As a result, the inverted activation signal HON' is asserted to a logic-high state. Also at the time $T_1$, the voltage $V_{GN1}$ is provided to activate the NFET $N_1$.

Responsive to the logic-low state of the activation signal HON, and thus the logic-high state of the inverted activation signal HON', the PFET $P_1$ is deactivated. The voltage $V_{GN1}$ activates the NFET $N_1$ to begin conducting the first sense current $I_1$ from the input voltage $V_{IN}$ through the first sense resistor $R_1$ and through the NFETs $N_1$ and $N_2$ to the switching terminal 204. Because the voltage difference $V_{DIFF}$ corresponding to the difference between the amplitude of the input voltage $V_{IN}$ and the voltage $V_{SW}$ at the switching terminal 204 is initially approximately zero, the first sense current $I_1$ is also approximately zero.

The first sense current $I_1$ is mirrored to generate the second sense current $I_2$, and the second sense current $I_2$ flowing through the shutoff node 210 generates the voltage $V_{OFF}$. The second sense current $I_2$ is also approximately zero at the time $T_1$, which thus sets the voltage $V_{OFF}$ approximately equal to the voltage $V_{CB}$. As demonstrated in the example of FIG. 3, and as provided by Equation 1, the voltage $V_{OFF}$ begins to increase during the first stage of the deactivation, resulting in a rapid decrease of the control voltage $V_{GHS}$. Therefore, during the first deactivation stage 304, the power switch $N_{HS}$ is rapidly deactivated, providing for a higher efficiency portion of the deactivation of the power switch $N_{HS}$.

At a time $T_2$, a second stage of deactivation of the power switch $N_{HS}$, demonstrated at 304, begins. During the second deactivation stage 304, as the power switch $N_{HS}$ deactivates, the current $N_{HS}$ begins to decrease. As a result, the voltage $V_{SW}$ at the switching terminal 204 decreases rapidly during the second deactivation stage 304. As a results, as provided by Equation 1, the voltage $V_{OFF}$ decreases. As a result, during the second deactivation stage 304, the control voltage $V_{GHS}$ levels off, thereby slowing the deactivation of the control switch $N_{HS}$.

At a time $T_3$, a third stage of deactivation of the power switch $N_{HS}$, demonstrated at 306, begins. During the third deactivation stage 306, beginning at the time $T_3$, the voltage $V_{SW}$ is approximately zero. Therefore, the voltage $V_{OFF}$ decreases to a very small amplitude as the power switch $N_{HS}$ deactivates. The control voltage $V_{GHS}$ therefore likewise decreases to fully deactivate the power switch $N_{HS}$ at a time $T_4$. In the example of FIG. 3, the input voltage $V_{IN}$ is demonstrated as slightly ringing, but the ringing exhibited by the input voltage $V_{IN}$ is significantly mitigated relative to a rapid deactivation of a power switch in a typical power supply system. Therefore, the example of FIG. 3 demonstrates an optimization of the deactivation of the power switch $N_{HS}$ to provide for an initially rapid deactivation to provide for efficient deactivation to mitigate switching losses, followed by a slower deactivation to mitigate ringing.

As described above, the examples of FIGS. 2 and 3 describe a high-side power switch deactivation driver that controls deactivation of a high-side power switch. However, the power switch deactivation driver can also be arranged to control deactivation of a low-side power switch. For example, a DC-DC buck converter having a high-side power switch and a low-side power switch can include the high-side power switch deactivation driver 200 to control deactivation of the high-side power switch $N_{HS}$, as well as a low-side power switch deactivation driver that controls deactivation of the low-side power switch in the same manner as described above (e.g., in a variable rate to optimize efficiency while mitigating switching losses). As another example, the power switch deactivation driver can be implemented as a low-side power switch deactivation driver for a DC-DC boost converter to control deactivation of the low-side power switch in the same manner as described above.

Figure 4:
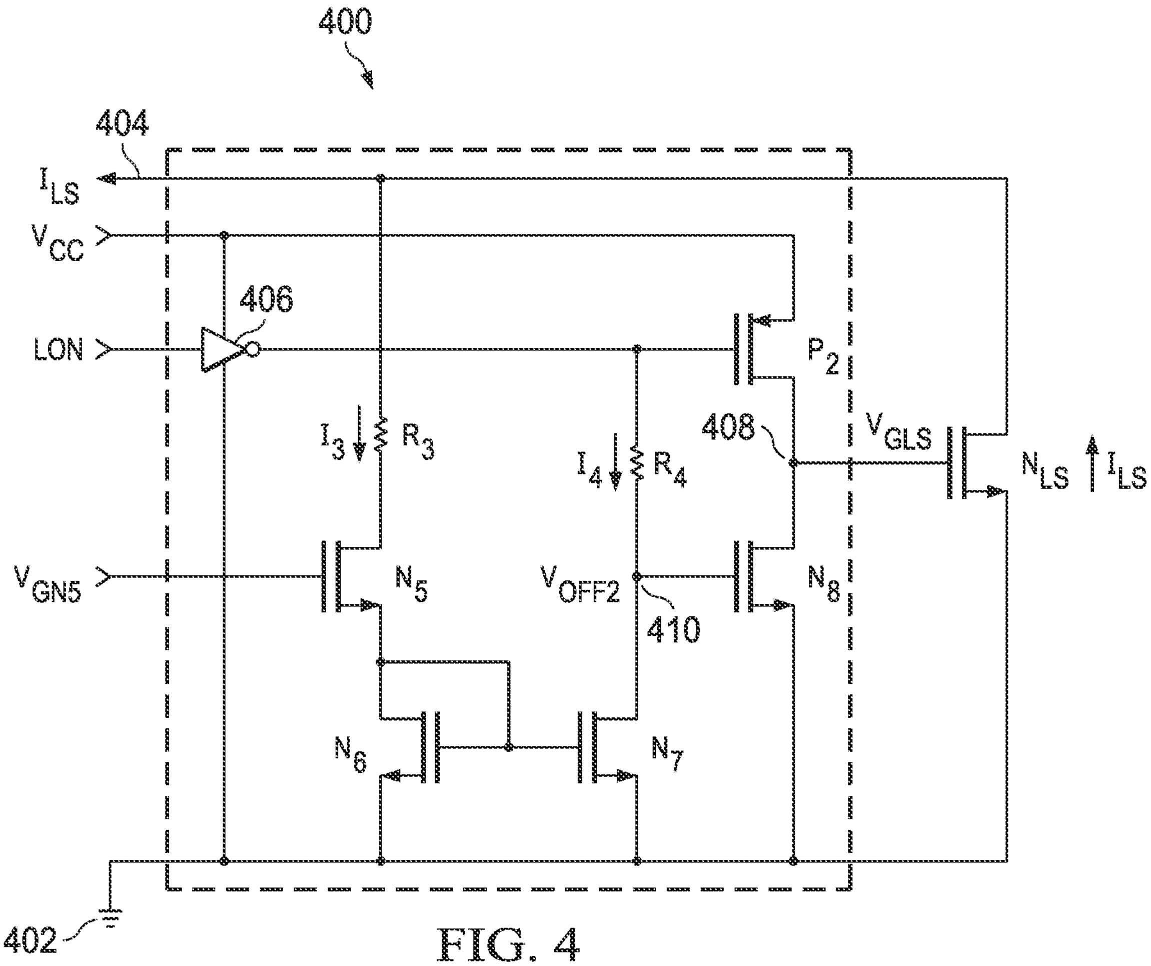
FIG. 4 is another example diagram of a power switch deactivation driver.

FIG. 4 is an example diagram of a power switch deactivation driver 400. The power switch deactivation driver 400 can correspond to the power switch deactivation driver 104 in the example of FIG. 1. Therefore, reference is to be made to the example of FIG. 1 in the following description of the example of FIG. 4. In the example of FIG. 4, the power switch deactivation driver 400 provides control of a low-side power switch, demonstrated as an NFET $N_{LS}$.

The power switch deactivation driver 400 is coupled to ground at a low-voltage rail 402, and receives an activation signal LON. The activation signal LON controls the activation and deactivation state of the power switch $N_{LS}$. Responsive to an activated state of the power switch $N_{LS}$, a current $I_{LS}$ flows from the low-voltage rail 402 to a switching terminal 404. The current $I_{LS}$ can thus be provided through an inductor to provide the output voltage $V_{OUT}$. The power switch deactivation driver 400 also receives a voltage $V_{CC}$ and a voltage $V_{GN5}$. The voltage $V_{CC}$ can be based on the voltage amplitude of the low-voltage rail, such as based on being coupled to the low-voltage rail 402 by a capacitor (not shown). For example, the voltage $V_{CC}$ can be greater than the voltage of the low-voltage rail 402 by approximately 5V. The voltage $V_{GN5}$ can be provided responsive to a second state of the activation signal LON, as described in greater detail herein. As an example, the low-voltage rail 402, the switching terminal 404, and the voltage $V_{CC}$ can be coupled to external pins of the associated IC package.

The activation signal LON is a binary signal provided through an inverter 406 to provide a signal LON'. The inverter 406 is demonstrated as biased by the low-voltage rail 402 and the switching terminal 404. Responsive to a first state of the activation signal LON (e.g., logic-high), the power switch $N_{LS}$ is activated. In the example of FIG. 4, the logic-high state of the activation signal LON is inverted to provide the signal LON' at a logic-low state. The inverted activation signal LON' is provided to the gate of a P-channel FET $P_2$. The PFET $P_2$ has a drain that is coupled to a control node 408 and a source that is coupled to the voltage $V_{CC}$. The control node 408 is coupled to the gate of the power switch $N_{LS}$, such that a control voltage $V_{GLS}$ controls the activation of the power switch $N_{LS}$. Therefore, responsive to the logic-low state of the inverted activation signal LON', the PFET $P_2$ is activated, thereby pulling the control voltage $V_{GLS}$ to be approximately equal to the voltage $V_{CC}$. Accordingly, the power switch $N_{LS}$ is activated to conduct the current $I_{LS}$ to the switching terminal 404.

Responsive to a second state of the activation signal LON (e.g., logic-low), the power switch $N_{LS}$ is deactivated at a variable rate of deactivation, as described herein. In the example of FIG. 4, the logic-low state of the activation signal LON is inverted to provide the signal LON' at a logic-high state. Therefore, responsive to the logic-high state of the inverted activation signal LON', the PFET $P_2$ is deactivated. Approximately concurrently with the falling-edge of the activation signal LON, the voltage $V_{GN5}$ is provided to activate an NFET $N_5$ having a drain coupled to a first sense resistor $R_3$ and a source coupled to an NFET $N_6$ that is coupled at a source to the switching terminal 404 and is diode-connected based on having a common gate-drain coupling. Upon activation, the NFET $N_5$ thus conducts a first sense current $I_3$ from the switching terminal 404 through the first sense resistor $R_3$ and through the NFETs $N_5$ and $N_6$ to the low-voltage rail 402. Therefore, the first sense current $I_3$ is proportional to a voltage difference between the low-voltage rail 402 and the voltage $V_{SW}$ at the switching terminal 404.

The gate of the NFET $N_6$ is coupled via the gate of an NFET $N_7$, such that the NFETs $N_6$ and $N_7$ are arranged as a current mirror. As an example, the NFET $N_7$ can be larger than the NFET $N_6$ (e.g., with respect to a channel width) by a factor K. Thus, the first sense current $I_3$ flowing through the NFET $N_6$ is mirrored through the NFET $N_7$ as a second sense current $I_4$ that is proportional (e.g., by the factor K) to the first sense current $I_3$. The second sense current $I_4$ flows from the inverted activation signal LON', through a second sense resistor $R_4$, and through the NFET $N_7$ to the switching terminal 404. The drain of the NFET $N_7$ and the second sense resistor $R_4$ are each coupled to a shutoff node 410 having a voltage $V_{OFF2}$. The gate of a shutoff switch $N_8$ is coupled to the shutoff node 410, with the drain of the shutoff switch $N_8$ being coupled to the control node 408 and the source of the shutoff switch $N_8$ being coupled to the switching terminal 404. Therefore, the shutoff switch $N_8$ controls the deactivation of the power switch $N_{LS}$. For example, the second sense current $I_4$ can change the amplitude of the voltage $V_{OFF2}$ in a variable manner responsive to the transition of the activation signal LON to a logic-low state, such that the activation of the NFET $N_8$ in a variable rate manner provides for a variable rate of change of the control voltage $V_{GLS}$. Accordingly, the power switch $N_{LS}$ is deactivated in a variable rate manner.

In this description, the term "couple" may cover connections, communications, or signal paths that enable a functional relationship consistent with this description. For example, if device A generates a signal to control device B to perform an action, then: (a) in a first example, device A is directly coupled to device B; or (b) in a second example, device A is indirectly coupled to device B through intervening component C if intervening component C does not substantially alter the functional relationship between device A and device B, so device B is controlled by device A via the control signal generated by device A.

Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device described herein as including certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor wafer and/or integrated circuit (IC) package) and may be configured to couple to at least some of the passive elements and/or the sources to form the described structure, either at a time of manufacture or after a time of manufacture, such as by an end user and/or a third party.

The techniques described in this disclosure may also be embodied or encoded in an article of manufacture including a non-transitory computer-readable storage medium. Example non-transitory computer-readable storage media may include random access memory (RAM), read-only memory (ROM), programmable ROM, erasable programmable ROM, electronically erasable programmable ROM, flash memory, a solid-state drive, a hard disk, magnetic media, optical media, or any other computer readable storage devices or tangible computer readable media. The term "non-transitory" may indicate that the storage medium is not embodied in a carrier wave or a propagated signal. In certain examples, a non-transitory storage medium may store data that can, over time, change (e.g., in RAM or cache).

Modifications are possible in the described embodiments, and other embodiments are possible, within the scope of the claims.

What is claimed is:

1. A system comprising:

a switch coupled between a power rail and a switching terminal, the switch having a control terminal; and a driver circuit having an input and an output, the output coupled to the control terminal of the switch, wherein the driver circuit is capable of, responsive to receiving a signal indicating activation or deactivation of the switch at the input, providing a control signal at the control terminal of the switch to control deactivation of conduction of a current from the power rail to the switching terminal at a variable rate.

2. The system of claim 1, wherein:

the signal at the input is a logic-high signal; and the control signal activates the switch to conduct the current from the power rail to the switching terminal.

3. The system of claim 1, wherein:

the signal at the input is a logic-low signal; and the control signal deactivates the switch to reduce conduction of the current from the power rail to the switching terminal.

4. The system of claim 1, wherein:

the variable rate of deactivation of conduction includes a first rate of deactivation followed by a second rate of deactivation of the switch; and the first rate is greater than the second rate.

5. The system of claim 1, wherein:

the switch is capable of deactivating conduction of the current in three stages;

a first stage includes a first deactivation rate of the switch based on an amplitude of the control signal;

a second stage includes a second deactivation rate of the switch, the second deactivation rate less than the first deactivation rate, the second deactivation rate based on the amplitude of the control signal; and a third stage includes a third deactivation rate that is complete deactivation of the switch responsive to a largest voltage difference between the power rail and the switching terminal.

6. The system of claim 1, wherein:

the switch is a high-side power switch of a DC-DC buck power supply system.

7. The system of claim 1, wherein:

the driver circuit includes an inverter with an input and an output; and the input of the driver circuit is coupled to the input of the inverter.

8. The system of claim 7, wherein:

the driver circuit includes a first resistor including a first terminal and a second terminal;

the driver circuit includes a second resistor including a first terminal and a second terminal;

the first terminal of the second resistor is coupled to the output of the inverter; and the first terminal of the first resistor is coupled to the power rail.

9. The system of claim 8, wherein:

the driver circuit includes a first transistor including a first terminal, a second terminal and a control terminal; and the first terminal of the first transistor is coupled to the second terminal of the first resistor.

10. The system of claim 9, wherein:

the driver circuit includes a second transistor with a first terminal coupled to the second terminal of the first transistor, a second terminal, and a control terminal; and the driver circuit includes a third transistor with a control terminal coupled to the control terminal of the second transistor, a first terminal coupled to the second terminal of the second resistor, and a second terminal coupled to the second terminal of the second transistor.

11. The system of claim 10, wherein:

the driver circuit includes a fourth transistor with a control terminal coupled to the first terminal of the second resistor, a first terminal, and a second terminal coupled to the inverter.

12. The system of claim 11, wherein:

the driver circuit includes a fifth transistor with a control terminal coupled to the second terminal of the second resistor, a first terminal coupled to the first terminal of the fourth transistor, and a second terminal coupled to the second terminal of the third transistor.

13. The system of claim 12, wherein:

the output of the driver circuit is coupled to the first terminal of the fourth transistor and the first terminal of the fifth transistor.

14. A circuit comprising:

a sense resistor coupled to a power rail and capable of conducting a sense current, wherein the sense current has an amplitude based on a voltage difference between the power rail and a switching terminal responsive to a state of an activation signal; and a shutoff switch capable of controlling an amplitude of a control voltage, wherein the control voltage is capable of controlling an activation of a power switch, the shutoff switch being controlled by the amplitude of the sense current to control the amplitude of the control voltage and to provide a variable rate of deactivation of the power switch.

15. The circuit of claim 14, wherein:

the variable rate of deactivation of the power switch comprises a first rate of deactivation of the power switch followed by a second rate of deactivation of the power switch.

16. The circuit of claim 15, wherein:

the first rate of deactivation is greater than the second rate of deactivation of the power switch.

17. The circuit of claim 14, wherein:

the sense resistor is a first sense resistor capable of conducting a first sense current; and the power switch includes:

a second sense resistor capable of conducting a second sense current responsive to the state of the activation signal; and a current mirror capable of mirroring the first sense current to generate the second sense current through the second sense resistor as proportional to the first sense current, wherein the shutoff switch comprises an input coupled to a shutoff node through which the second sense current flows, such that the shutoff switch is controlled by the amplitude of the second sense current.

18. The circuit of claim 17, wherein:

the second sense current flows from the activation signal to the power rail or the switching terminal.

19. The circuit of claim 14, wherein:

the deactivation of the power switch occurs in three stages responsive to the activation signal indicating a deactivation state; p1 a first stage includes a first rate of deactivation of the power switch based on the amplitude of the control voltage;

a second stage includes a second rate of deactivation of the power switch based on the amplitude of the control voltage; and a third stage includes a third rate of deactivation of the power switch responsive to a largest voltage difference between the power rail and the switching terminal.

20. The power switch of claim 19, wherein:

the first rate of deactivation is greater than the second rate of deactivation; and the third rate of deactivation is complete deactivation of the power switch.

* * * * *